United States Patent
Negishi et al.

(10) Patent No.: US 7,585,776 B2
(45) Date of Patent: Sep. 8, 2009

(54) DRY ETCHING METHOD OF INSULATING FILM

(75) Inventors: Nobuyuki Negishi, Tokyo (JP);
Masatoshi Oyama, Kudamatsu (JP);
Masahiro Sumiya, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 234 days.

(21) Appl. No.: 11/668,057

(22) Filed: Jan. 29, 2007

(65) Prior Publication Data
US 2008/0085605 A1  Apr. 10, 2008

(30) Foreign Application Priority Data
Oct. 4, 2006  (JP)  ............... 2006-272402

(51) Int. Cl.
*H01L 21/302*  (2006.01)
(52) U.S. Cl. ............... 438/706; 438/714
(58) Field of Classification Search ............... 438/706, 438/710, 714, 723, 724, 725; 216/67, 74
See application file for complete search history.

(56) References Cited

U.S. PATENT DOCUMENTS

| | | | | |
|---|---|---|---|---|
| 5,830,605 A | * | 11/1998 | Umeki et al. | 430/5 |
| 6,204,193 B1 | * | 3/2001 | Jozaki | 438/723 |
| 6,214,496 B1 | * | 4/2001 | Carpio et al. | 430/5 |
| 2002/0039843 A1 | * | 4/2002 | Ikeda et al. | 438/738 |
| 2003/0001180 A1 | * | 1/2003 | Narimatsu et al. | 257/296 |
| 2005/0101137 A1 | * | 5/2005 | Kato et al. | 438/689 |
| 2006/0086961 A1 | * | 4/2006 | Iijima et al. | 257/303 |
| 2007/0284335 A1 | * | 12/2007 | Tsujimoto | 216/41 |

FOREIGN PATENT DOCUMENTS

JP  2002-110647  4/2002

* cited by examiner

*Primary Examiner*—Kin-Chan Chen
(74) *Attorney, Agent, or Firm*—Antonelli, Terry, Stout & Kraus, LLP.

(57) ABSTRACT

It is an object to provide a high-precision method for forming deep holes of elliptic pattern, which can improve hole directionality on the short diameter side, the hole directionality being possibly deteriorated as a result of excessive polymer deposition in the initial etching stage. The insulating film dry etching method is for treating a work on which a mask of elliptic pattern is formed with a fluorocarbon gas, wherein the etching process is divided into a first and second steps after the etching is started, the first step operating to deposit a polymer at a rate set lower than that in the second step, and controlling step time in accordance with ellipticity (long diameter/short diameter ratio) of the elliptic pattern.

9 Claims, 8 Drawing Sheets

DRY ETCHING METHOD OF INSULATING FILM

FIELD OF THE INVENTION

The present invention relates to a dry etching apparatus and dry etching method, in particular for etching interlayer insulating films, characterized by improved capability of forming elliptic patterns as wafer (work) patterns, e.g., high aspect ratio hole, which have high hole directionality, in particular on the short diameter side.

BACKGROUND OF THE INVENTION

How capacity (capacitor capacity) is kept is an important consideration for memory devices represented by dynamic random access memories (DRAMs) as their integration degree increases. Capacitor structures broadly fall into two categories, trench capacitors and stacked capacitors, where a silicone substrate is provided with deep grooves in the former and a transistor is located beneath a capacitor in the latter. In each structure, it is necessary to increase capacitor height or decrease dielectric film thickness, in order to increase capacitor capacity. Increasing capacitor height depends on etching capability, and decreasing dielectric film thickness depends on development of high dielectric materials, because thickness of a silicon oxide film is approaching the lower limit. On the other hand, pattern shape itself has an effect on improvement of capacity. Elliptic patterns are now prevailing, replacing truly circular ones, to keep a higher capacity for the same area.

Dry etching is a technique which applies rf power from an external source to an etchant gas introduced into a vacuum chamber to produce a plasma therein, where reactive radicals or ions produced in the plasma are precisely reacted over a wafer to selectively etch a film work while minimizing effects on other materials, e.g., a mask represented by resist and interconnecting layer or base substrate located underneath via hole, contact hole, and storage node in a capacitor.

For forming via holes, contact holes and storage nodes in a capacitor, a mixture of a fluorocarbon gas, noble gas represented by Ar or the like, oxygen gas and so forth is treated at 0.5 to 10 Pa to produce a plasma, and the ion energy hitting a wafer is accelerated to 0.5 to 4.0 kV. The useful fluorocarbon gases include $CF_4$, $CHF_3$, $C_2F_6$, $C_3F_6O$, $C_4F_8$, $C_5F_8$, $C_4F_6$ and $C_6F_6$. The etching technique for these devices has applied bias power to a wafer after a plasma is ignited and sufficiently grown. Applying bias power to a wafer when a plasma is not sufficiently grown or not ignited under some plasma conditions will cause troubles resulting from insufficient or substantially no current flowing into the wafer, with the result that a bias power supply line, electrode on which the wafer is set or wafer itself may be exposed to an abnormally high voltage. These problems, in turn, may cause dielectric breakdown of the bias power supply line, breakdown of a film formed by spraying on the electrode or cracking of the wafer. Therefore, a means for detecting plasma ignition (optical emission intensity monitor) is generally provided for mass production to allow bias power to be applied to a wafer in a certain time after the means detects plasma ignition. At the same time, gas conditions (gas species and flow rate) and cooling gas pressure on the wafer back side are basically kept constant during the etching process. On the other hand, a step etching is proposed (e.g., by Patent Document 1) to produce holes of high aspect ratio at a high mask-selectivity without causing shape abnormality, e.g., boring, in which process steps are changed from each other in accordance with processed aspect ratio or CF-based deposit quantity.

Patent Document 1: JP-A-2002-110647

BRIEF SUMMARY OF THE INVENTION

Figure 10A:
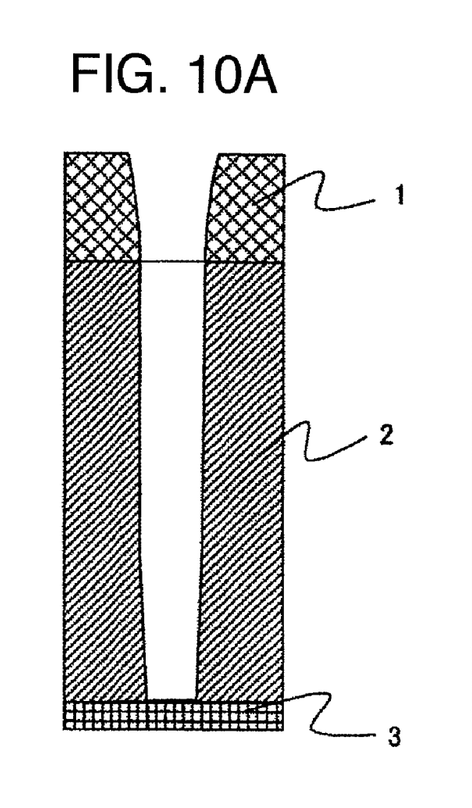
Figure 10B:
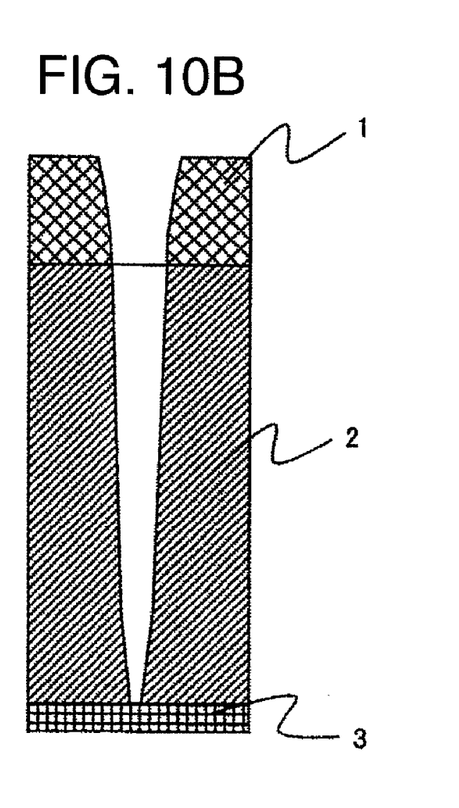

However, shape abnormality resulting from elliptic pattern will still occur even when a stepped etching process is adopted. FIG. 10 schematically illustrates a shape formed to have an elliptic pattern, FIG. 10A for the shape on the long diameter side and FIG. 10B that on the short diameter side. As illustrated, the cross-section on the long diameter side is etched vertically, but that on the short diameter side is tapered. Such a shape causes troubles, e.g., insufficient capacitor capacity, and breakdown of a capacitor resulting from insufficient mechanical strength in a device structure with capacitors on both sides.

It is an object of the present invention to provide an etching method which can secure shape perpendicularity on the short diameter side for forming a storage node of elliptic pattern in a capacitor.

The method of the present invention tries to reduce quantity of fluorocarbon deposited on a wafer during the initial etching stage to secure hole directionality on the short diameter side in a processed shape of elliptic pattern.

The present invention provides an insulating film dry etching method for treating a work on which a mask of elliptic pattern is formed with a fluorocarbon gas, wherein the etching process is divided into a first and second steps after the etching is started, the first step operating to deposit a polymer at a rate set lower than that in the second step, and controlling step time in accordance with ellipticity (long diameter/short diameter ratio) of the elliptic pattern.

Another aspect of the present invention is an insulating film dry etching method for treating a work on which a mask of elliptic pattern is formed with a fluorocarbon gas, wherein the etching process is divided into a first and second steps after the etching is started, the first step operating to deposit a polymer at a rate set lower than that in the second step, the rate being controlled in accordance with ellipticity (long diameter/short diameter ratio) of the elliptic pattern.

Still another aspect of the present invention is an insulating film dry etching method for treating a work on which a mask of elliptic pattern is formed with a fluorocarbon gas, wherein the etching process is divided into a first and second steps after the etching is started, the first step controlling gas pressure on the work back side in accordance with ellipticity (long diameter/short diameter ratio) of the elliptic pattern.

Other objects, features and advantages of the invention will become apparent from the following description of the embodiments of the invention taken in conjunction with the accompanying drawings.

BRIEF DESCRIPTION OF THE DRAWINGS

FIG. 3 (FIGS. 3A and 3B) compares a conventional sequence with a low-deposition sequence.

FIG. 4 (FIGS. 4A to 4E) schematically illustrates a cross-section of an elliptic pattern shape formed on the short diameter side.

FIG. 10 (FIGS. 10A and 10B) schematically illustrates cross-sections of treated elliptic pattern FIG. 11 (FIGS. 11A and 11B) illustrates a sequence with an interpolating step.

DESCRIPTION OF REFERENCE NUMERALS

1 Resist
2 Silicon oxide film
3 Silicon nitride film
4 Deposited fluorocarbon film
5 Vacuum chamber
6 Gas introducing tube
7 Lower electrode
8 Wafer (Work)
9 Mass flow controller
10 Dielectric material
11 Electrostatic chuck
12 Matching box
13 Rf bias power source
14 Optical fiber
15 Monochrometer
16 Photoelectric multiplier
17 Measuring personal computer
18 Database personal computer
19 Controlling personal computer
20 Radiation thermometer
21 Fine tube

DETAILED DESCRIPTION OF THE INVENTION

The embodiments of the present invention are described by referring to the attached drawings.

EXAMPLE 1

Example 1 describes an insulating film dry etching method for treating a wafer on which a mask of elliptic pattern is formed with a fluorocarbon gas, wherein an etching step in the initial etching stage, in which the wafer is at a lower temperature than in the main, steady-state etching step, adopts a condition controlled to keep deposition lower than in the steady-state etching step, in order to secure hole directionality on the short diameter side of the elliptic pattern.

Figure 1:
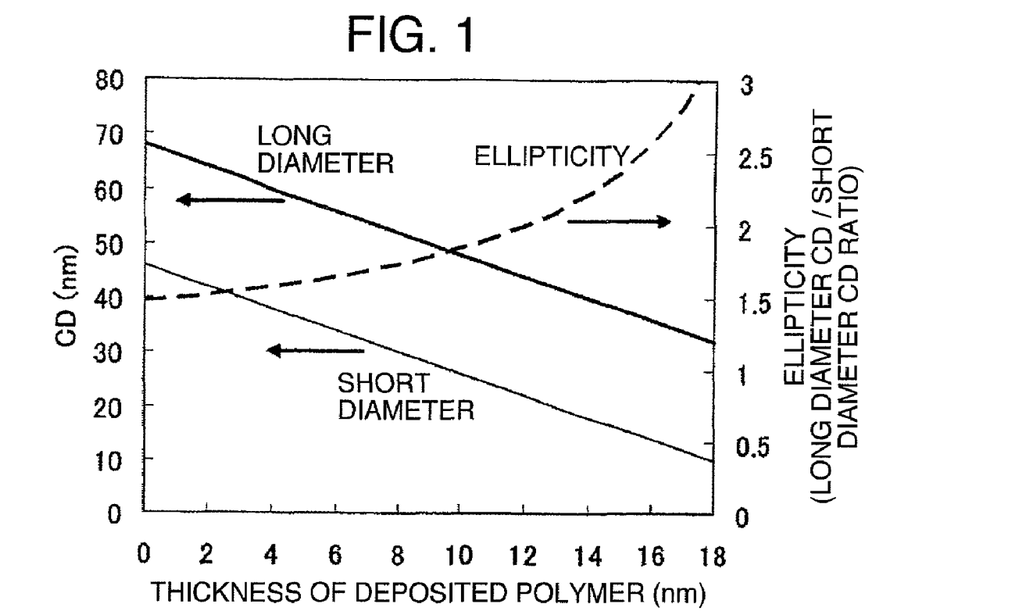
FIG. 1 presents a relationship between deposited polymer thickness and ellipticity
Figure 2:
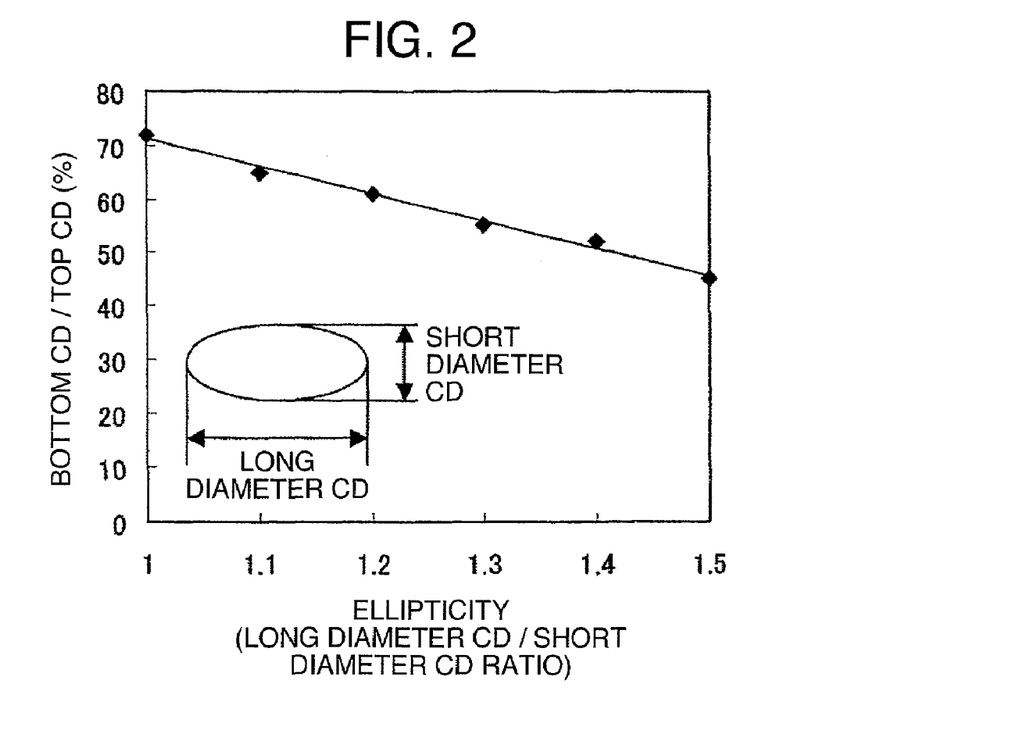
FIG. 2 presents a relationship between bottom CD/top CD ratio on the short diameter side and ellipticity.

A fluorocarbon film is deposited thicker in the initial stage of etching, in which a wafer is at a lower temperature than in the main, steady-state etching step. In this case, ellipticity of the elliptic pattern, defined as long diameter/short diameter ratio, will rapidly increase when the film is deposited evenly on the long diameter and short diameter wall sides, as illustrated in FIG. 1. Moreover, relationship between deposit thickness and ellipticity greatly depends on initial ellipticity. A film deposited on a flatter (i.e., higher ellipticity) shape has ellipticity increasing faster for the same deposit quantity. FIG. 2, on the other hand, illustrates a relationship between bottom critical dimension (CD)/top CD ratio on the short diameter side and ellipticity. As illustrated, the bottom CD on the short diameter side becomes more difficult to secure as ellipticity increases. Combining the relationships illustrated in FIGS. 1 and 2, it is understood that to what extent excessive deposition in the initial etching stage is controlled is important for keeping hole directionality on the short diameter side, and that necessary extent of controlling deposition varies depending on initial ellipticity.

First, a case in which an etching step carried out under a low deposition condition is adopted in the initial etching stage is described. More specifically, the initial etching step uses a CxFy gas (x: 1, 2, 3, 4, 5 or 6, and y: 4, 5, 6 or 8) having a lower C/F ratio than that used under a main etching condition, to control polymer deposition. Basically, decreasing C/F ratio of CxFy gas reduces deposited polymer quantity at constant plasma-forming power. Therefore, use of a gas of lower C/F ratio in the initial etching stage, in which a steady-state etching condition is not attained yet, can control quantity of fluorocarbon polymer deposited on a wafer before wafer temperature attains a steady-state level. The two-stage etching process with the step operating under a main etching condition following the initial step can improve hole directionality on the short diameter side of an elliptic pattern without adversely affecting etching characteristic. Controlling flow rate of a CxFy gas (x: 1, 2, 3, 4, 5 or 6, and y: 4, 5, 6 or 8) is another procedure for bringing the similar effect. More specifically, keeping gas flow rate lower in the initial etching step than in the main etching step can avoid excessive polymer deposition in the initial stage.

It is recommended to supply a diluent gas of noble gas, oxygen gas or nitrogen gas at a higher rate in the initial etching step than in the main etching step.

Next, a case in which an etching step is carried out with gas pressure on the work back side is kept lower than that under a main etching condition is adopted in the initial etching stage is described. This allows the initial etching step to operate at a higher wafer temperature than the subsequent main etching step. Wafer temperature is generally controlled by passing a cooling medium, e.g., fluorinate, in an electrode on which a wafer is placed and by containing helium gas known to have a high thermal conductivity in a space between a wafer and electrode surface to improve thermal contact between them. Wafer temperature is uniquely determined by pressure of helium gas on the back side, when bias power is applied to the wafer cooled with a coolant kept at a certain temperature.

Figure 4A:
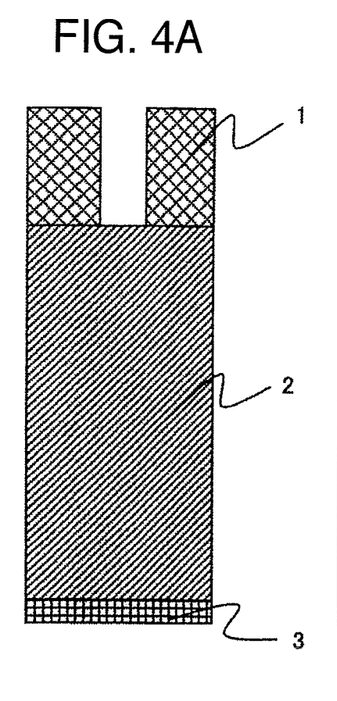

First, the sample is described. A resist for ArF lithography is generally not etching-resistant, striation-controlling processes which try optimization of etchant gas species and so forth have been proposed, as disclosed by JP-A-2005-072518 and JP-A-2005-109444. However, processes for producing single-layer ArF resist films are increasingly difficult to establish as devices become finer and etching load increases, which demand thinner ArF resist films and patterns of higher aspect ratio, respectively. Therefore, processes for producing device structures which incorporate multi-layered resist films are now prevailing to transfer patterns to masters of higher resistance to etching and heat. As illustrated in FIG. 4 A, Example 1 also adopted a resist 1 of high etching resistance as a mask, produced by a multi-layered resist process. A silicon oxide film 2 and silicone nitride film working as an etching stopper are provided in this order beneath the resist 1.

Next, etching conditions adopted in Example 1 are described specifically. A mixed etchant gas of Ar, $C_4F_6$ and $O_2$ was used for etching capacitor storage nodes to secure mask selectivity, flown at respective rates of 500, 60 and 70 mL/minute. Gas pressure in a vacuum chamber and plasma-generating rf power were set at 2 Pa and 500 W. Bias power to be applied to a wafer was set at 5 kW, in consideration of the wafer size of 12 inches. Bias frequency was 4 MHz, which generated a Vpp of 2.5 kV on the wafer. Wafer surface temperature under a steady-state condition can be kept at 100° C. by setting temperature of a cooling medium circulating around the electrode at, e.g., −20° C. In Example 1, however, it was kept at 140° C. by setting cooling medium temperature at +20° C., in consideration of high heat resistance of the mask used, in order to prevent shape abnormality, e.g., boring.

Figure 3A:
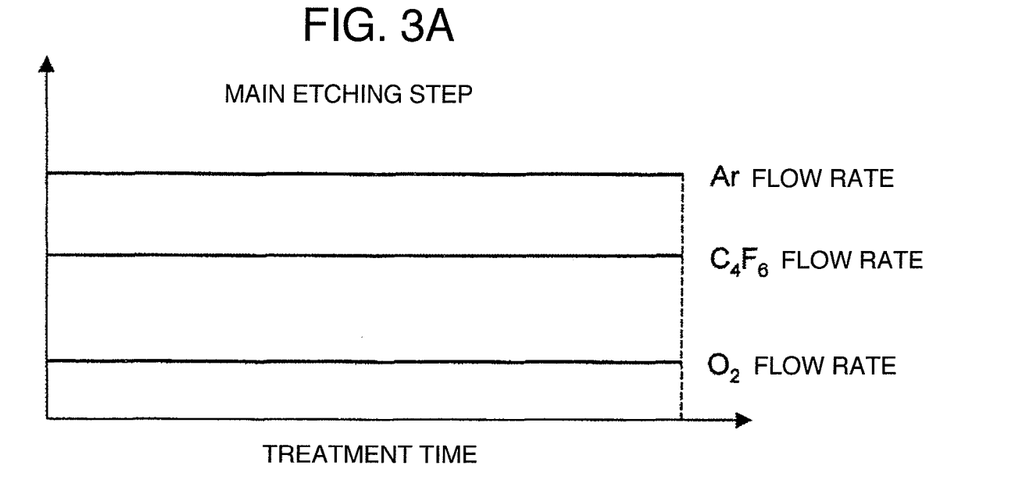
Figure 3B:
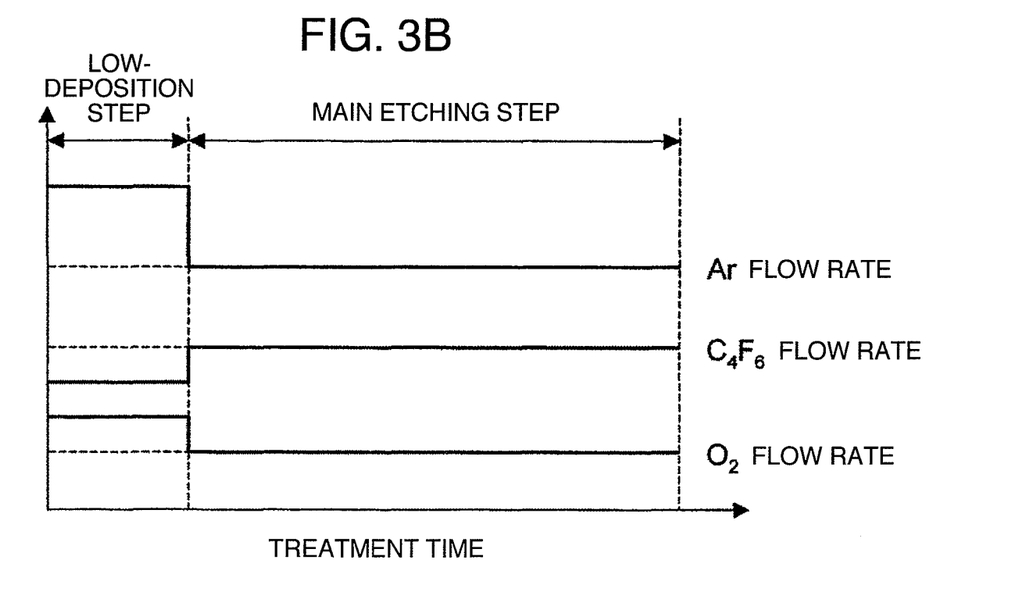
Figure 4B:
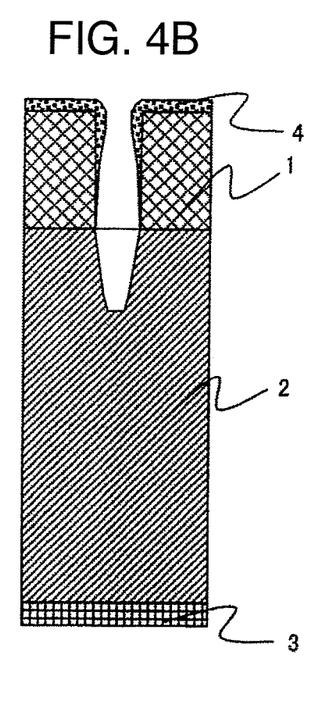
Figure 4C:
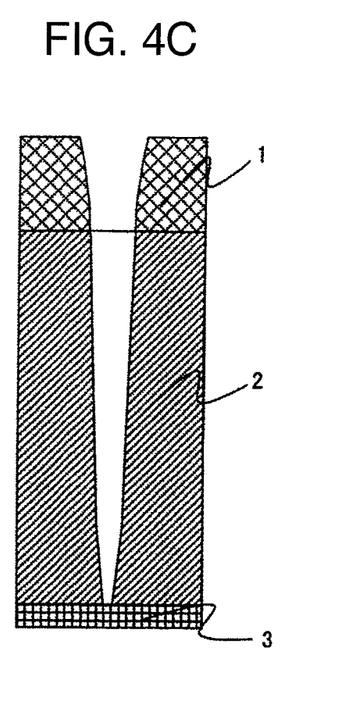
Figure 4D:
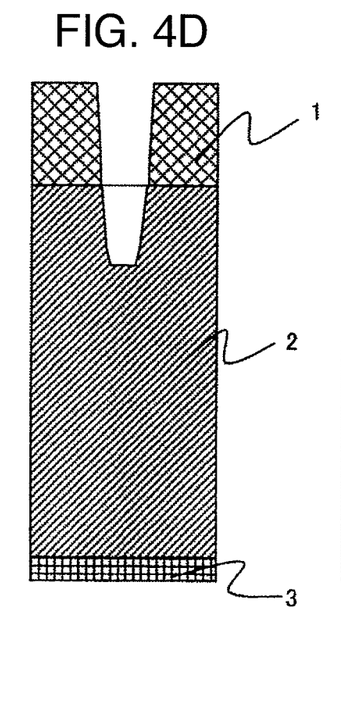
Figure 4E:
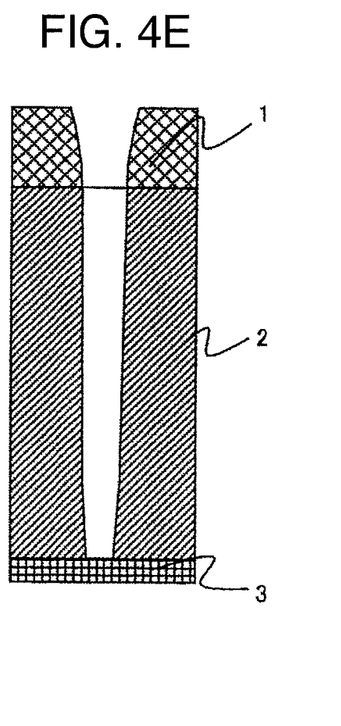
Figure 5:
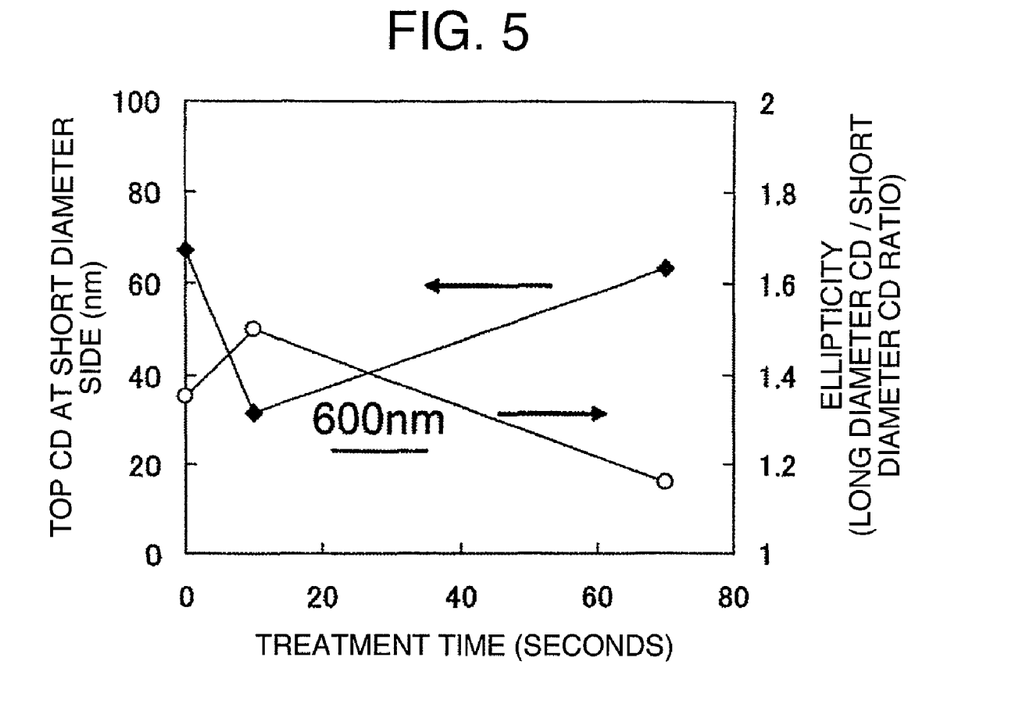
FIG. 5 shows treatment time dependence of top CD and ellipticity.

FIG. 3 illustrates an etching sequence evaluated, FIG. 3A illustrating a conventional sequence and FIG. 3B a low-deposition sequence. The conventional sequence adopted constant gas conditions throughout the etching process. The etched shape, observed 10 seconds after the etching was started, was overhung with an excessive quantity of deposited fluorocarbon film 4 formed on the mask, as illustrated in FIG. 4B. The mask top CD expanded thereafter as wafer surface temperature increased to give time-dependence of the top CD and ellipticity shown in the FIG. 5 graph. The low-deposition sequence illustrated in FIG. 3B, on the other hand, adopted changed Ar, $C_4F_6$ and $O_2$ gas flow rates among the gas conditions set at respective 1000, 50 and 200 mL/minute in the first step. However, wafer bias power was kept unchanged at 5 kW, because of importance of increasing wafer temperature to a steady-state level. The step time was set at 20 seconds. As a result, excessive deposition was not observed even 10 seconds after the etching was started, as illustrated in FIG. 4D, and the wafer showed no decrease in top CD and no increase in ellipticity. FIG. 4C illustrates the wafer etched by the conventional sequence, and FIG. 4E illustrates that etched by the low-deposition sequence, where overetching extent was set at 40% in both sequences, and the main etching step in the latter sequence was adjusted to have the total overetching extent of 40% in the first and main steps. As a result, the wafer etched by the low-deposition sequence had a much different CD shape, although top CD shapes were essentially the same. More specifically, the wafer etched by the conventional sequence had a bottom CD/top CD ratio of 40% representing hole directionality on the short diameter side, which was improved up to 60% by the low-deposition sequence. However, the first step under the low-deposition conditions could not secure mask-selectivity, because of lower deposition amount than that in the main step. Mask-selectivity was 4 in the low-deposition step, comparing with 8 in the main step. A minimum time must be allocated to the low-deposition step, but a required total mask-selectivity could not be attained when the step is carried out for an excessive time, causing striation resulting from insufficient mask-selectivity.

It is necessary to control step time, deposited quantity of polymer and gas pressure on the work back side in the low-deposition step in accordance with ellipticity (long diameter/short diameter ratio). The sample used in Example 1 had an ellipticity of 1.3. A pattern having an ellipticity of 1.1, which is fairly close to a true circle, will not need a low-deposition step time of 20 seconds, and the effect was observed when the time was reduced to 15 seconds. For a flatter pattern having an ellipticity of 1.5 needed a step time of 25 seconds.

Figure 6:
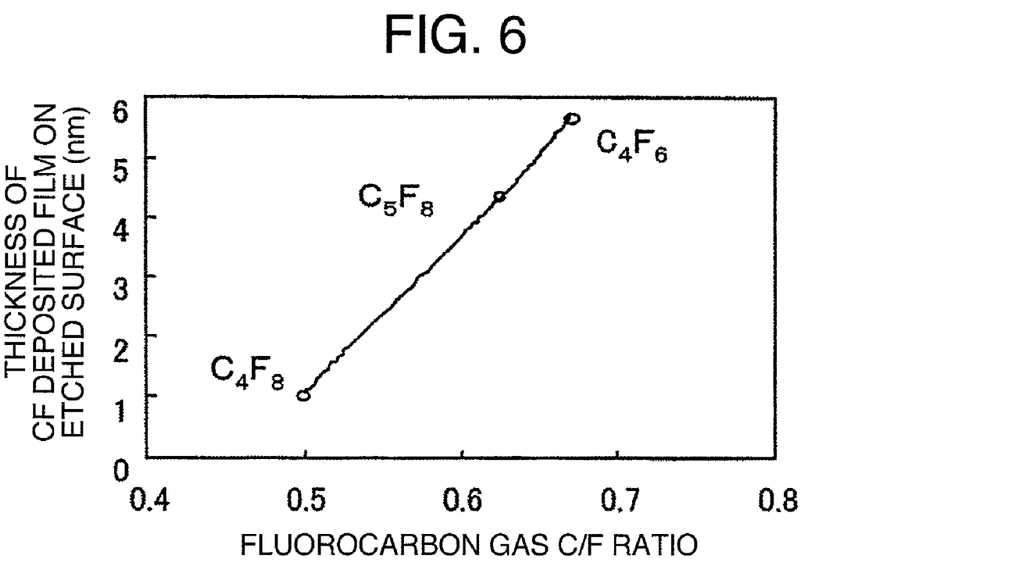
FIG. 6 presents a relationship between deposited CF film thickness and fluorocarbon gas C/F ratio under steady-state etching conditions.

Example 1 has described an example of preventing excessive polymer deposition in the initial etching stage by changing set flow rates of the same gas species. The effect of the present invention can be realized by changing gas species. Knowing that deposited quantity decreases as fluorocarbon gas C/F ratio decreases, as illustrated in FIG. 6, it is necessary to use a fluorocarbon gas having a lower C/F ratio in the low-deposition step in the initial etching stage than in the main etching step.

Figure 8:
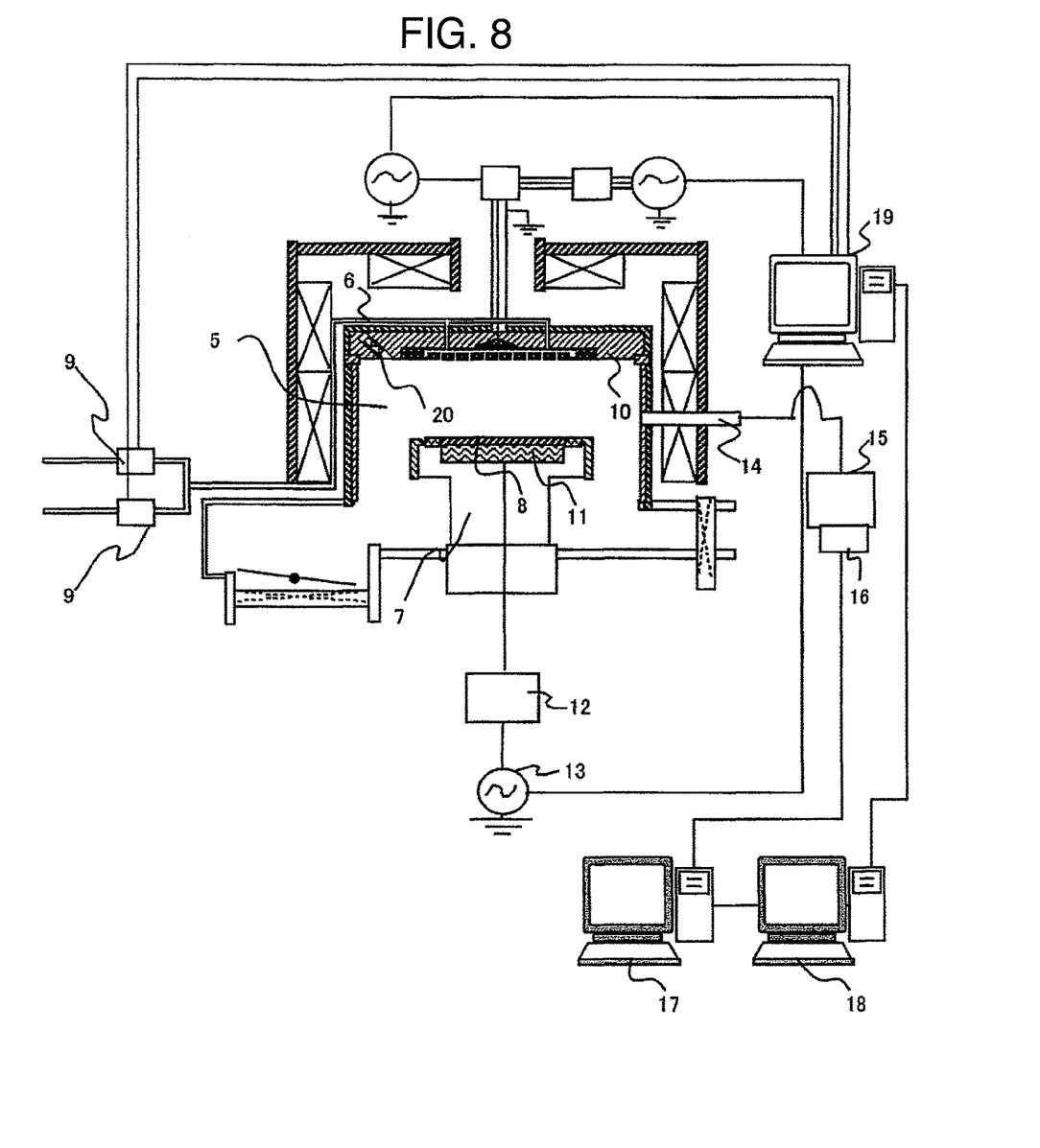
FIG. 8 outlines an etching apparatus for realizing the aspect of the present invention described in Example 2.
Figure 9:
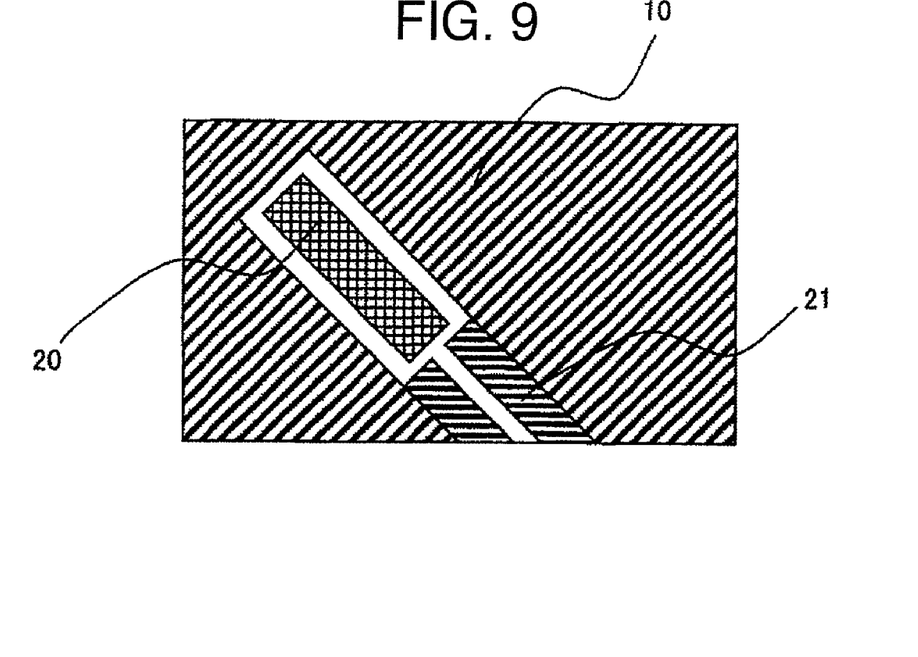
FIG. 9 is a magnified view of radiation thermometer sensor.

Moreover, Example 1 kept helium gas contained in the space between the wafer and electrode at a constant pressure in the low-deposition and main etching steps. However, it is needless to say that the effect can be realized by decreasing helium gas pressure on the wafer back side to increase a rise time of wafer surface temperature while gas conditions, wafer bias power are kept constant in these steps. In this treatment case, helium pressure on the wafer back side may be set based on preliminary test results. Otherwise, it is also effective to control helium pressure on the wafer back side in such a way to keep wafer surface temperature within a given range, continuously monitored by a radiation thermometer 20 provided at an angle in a dielectric 10 facing the wafer, as illustrated in FIG. 8. Instead of wafer surface temperature monitoring, helium pressure on the back side may be set automatically or manually to have a desired pressure profile based on treatment time dependence of wafer surface temperature, estimated from etching conditions. When a radiation thermometer is provided, it is recommended to set the thermometer at the back of a fine tube 21, as illustrated in FIG. 9 which presents a magnified drawing of the thermometer. This prevents fogging of the thermometer sensor by fluorocarbon deposits formed in a plasma.

A combination of changed fluorocarbon gas flow rate, gas species used, helium pressure on the back side and low-deposition step time can also realize the similar effect, as discussed in Example 1.

It is also important to minimize time from plasma ignition to application of rf bias power necessary to accelerate the ions in order to control polymer deposition in the initial etching stage, in addition to the measures described above. Applying bias power to a wafer before a plasma is sufficiently grown will cause troubles resulting from insufficient current flowing into the wafer, with the result that a bias power supply line, electrode or wafer may be exposed to an abnormally higher voltage than that in the normal operating period. These problems, in turn, may cause dielectric breakdown of the bias power supply line, or cracking of the wafer. It is therefore important to monitor plasma ignition conditions and control rf bias power application timing based on the monitored conditions.

EXAMPLE 2

Figure 7:
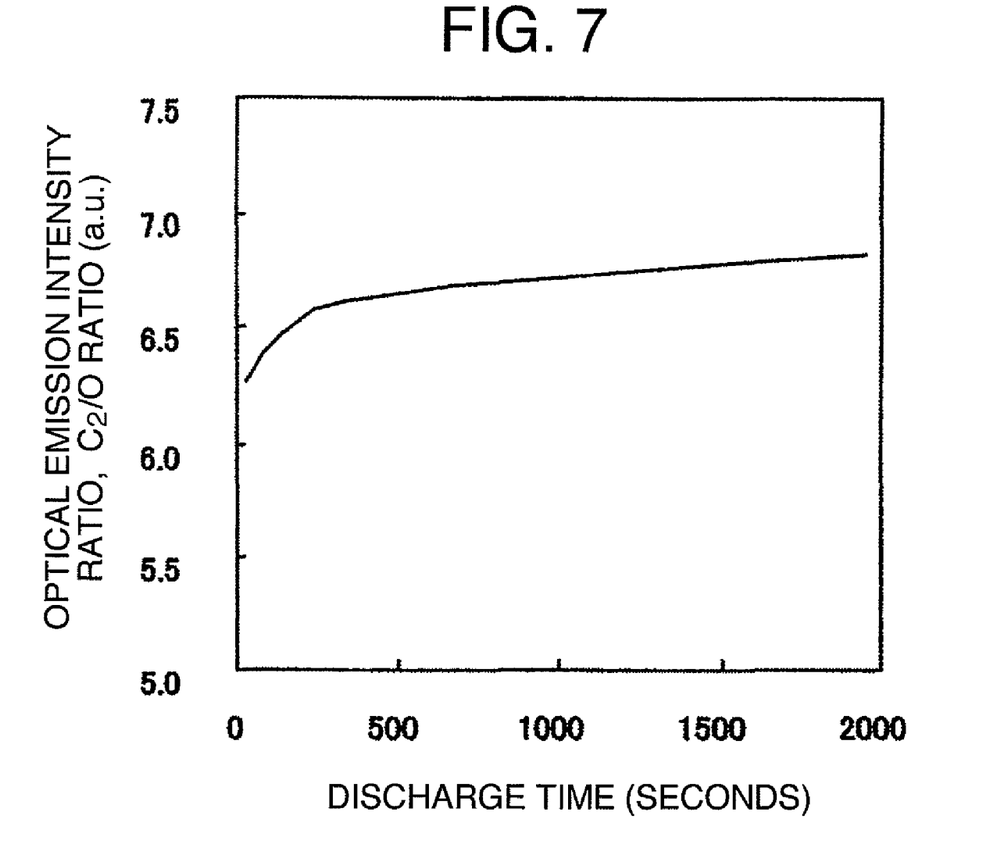
FIG. 7 presents a relationship between optical emission intensity ratio ($C_2$/O ratio) and time elapsed after discharge is started.

The dry etching treatment was carried out in Example 2 in the same manner as in Example 1, except that the low-deposition step in the initial etching stage was controlled based on monitored quantity of radicals produced in a plasma. FIG. 7 presents monitored results of optical emission intensity ratio $C_2/O$ after a plasma is ignited in a vacuum chamber while its walls are cold, where the radical species responsible for carbon deposition and that for removing the deposited species were represented by $C_2$ and O, respectively. It shows that the radical species in a plasma are adsorbed on the walls for about 200 seconds after discharge is initiated, because the vacuum chamber walls remain cold, and the ratio is lower than it should be. A balance is produced thereafter between species adsorbed on and desorbed from the walls, with the result that the ratio increases only gradually while showing a saturation trend. In other words, deposited polymer quantity increases in the initial etching stage as number of treated wafers increases in a mass production line under the same conditions. As discussed in Example 1, hole directionality on the short diameter side of an elliptic pattern can be improved by controlling (preventing) quantity deposited on the wafer surface in the initial etching stage. How etching characteristic is kept stable is important while a number of wafers from the first to Nth are treated in a mass production line.

When a plurality of works are treated, continuously in particular, it is recommended to monitor radical quantity in a plasma for a work, in order to control step time, gas conditions for controlling deposited polymer quantity or helium pressure on the back side in the low-deposition step for the subsequent work, based on the monitored results.

FIG. 8 outlines an apparatus for etching treatment in Example 2. The etching treatment was carried out by the apparatus comprising a vacuum chamber 5, tube 6 for introducing the etchant gas and mass flow controller 9, where a work 8 was set on a lower electrode 7 equipped with an electrostatic chuck 11. The lower electrode is connected to an rf bias power source 13 via a matching box 12. The etching apparatus is also equipped with an emission spectrometer system to monitor light emitted from a plasma. The spectrometer system comprises optical fibers 14, a monochrometer 15, photoelectron multiplier 16 and measuring personal computer 17 for data sampling. The photoelectron multiplier 16 may be replaced by a CCD camera for simultaneously measuring light of plural wavelengths. A database personal computer 18 is provided between a controlling personal computer 19 and the measuring personal computer 17, the computer 19 for controlling etching conditions and computer 18 for instructing to automatically change etching conditions based on outputs from the computer 17. The database stores an objective optical emission intensity or optical emission intensity ratio and corresponding low-deposition step condition controlling guideline. When $C_2$ optical emission intensity or $C_2/O$ ratio tends to increase as number of wafers treated increases, low-deposition step conditions are changed for the wafers to be subsequently treated. More specifically, (1) low-deposition step time is extended, (2) a gas condition is changed (increasing Ar flow rate, decreasing $C_4F_6$ flow rate or increasing $O_2$ flow rate), (3) helium pressure on the back side is decreased, or (4) timing of supplying He to the back side after a plasma is ignited is retarded. These controlling guidelines may be experimentally determined beforehand for their regularity, or automatically prepared by simulation. Moreover, the database personal computer 18 may store low-deposition step conditions corresponding to elliptic pattern shape (ellipticity).

Next, the process flow is specifically described. The database personal computer 18 presents optimum low-deposition step conditions after receiving elliptic pattern shape information, and treatment of the first wafer is started under the presented conditions. It is not essential to follow the conditions, because they are merely presented to start the treatment. Separately set conditions will be adopted, when the above conditions are not followed. Light emitted from a plasma are kept monitored by the emission spectrometer system, which monitors an optical emission intensity ratio (R1_1) at a given time t1 after the main etching step is started and optical emission intensity ratio (R1_2) at a given time t2 just before completion of the step. The second wafer treated under the same conditions is also monitored for (R2_1) and (R2_2) at a given time t1 and t2. R3_1 of the third wafer is predicted based on these 4 data, and low-deposition step conditions are determined for the wafer, when the predicted R3_1 is considered to deviate from the allowable level, which is set beforehand. The procedure described above is for setting treatment conditions after predicting light emission data, based on the data of the preceding wafers, for the subsequent one. The similar effect can be realized by changing treatment conditions, e.g., gas condition, in real time based on the light emission data obtained when the treatment is actually started. Conditions of cleaning (including cleaning time) carried out between the wafer treatment steps may be also adequately changed. The effect of the present invention will not be damaged whether a dummy wafer is used or not for determining cleaning conditions. Described above is the procedure only for changing low-deposition step conditions in the initial etching stage in accordance with changed light emission conditions. However, a more precise and stable process can be realized when conditions of the main step following the low-deposition step are similarly changed.

EXAMPLE 3

Figure 11A:
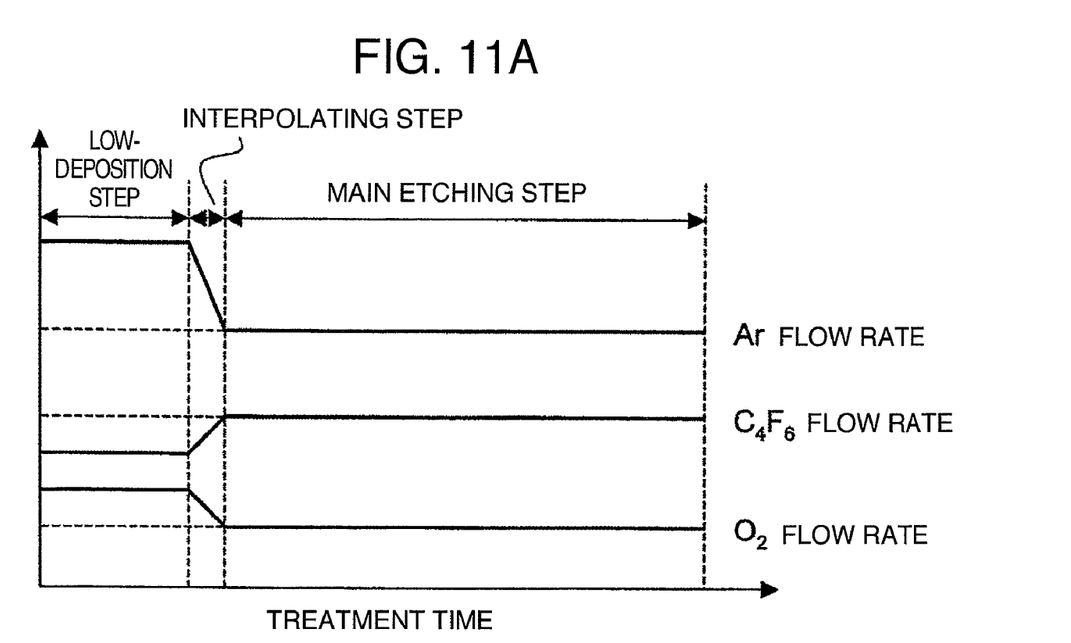
Figure 11B:
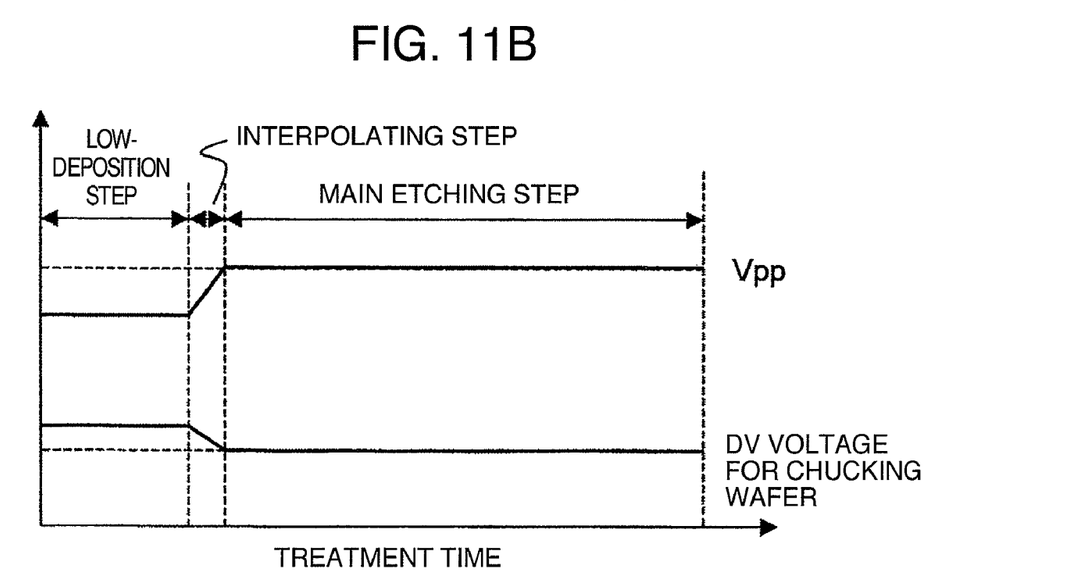

Example 3 describes a procedure for applying a DC voltage to an electrode to electrostatically adsorb a wafer thereon and procedure for monitoring voltage and current for the work treated under the low-deposition step conditions to prevent excessive polymer deposition in the initial etching stage, described in Examples 1 and 2. As already discussed in Example 1, a mixed gas is supplied into a vacuum chamber in the low-deposition step at a rate much different from that in the main etching step. As a result, plasma density is sharply changed between these steps. At the same time, Vpp applied to a wafer greatly changes in this process because of large wafer bias power. As illustrated in FIG. 3B, plasma density is high to give a Vpp of 2.1 kV in the low-deposition step, because of high Ar flow rate and low $C_4F_6$ and $O_2$ flow rates. In the main etching step, on the other hand, plasma density decreases to rapidly increase Vpp to 2.5 kV. Assuming that Vpp represents a voltage peak amplitude produced by wafer bias power, a subduction voltage Vdc of Vpp/2 at the highest relative to ground potential evolves on the wafer. On the other hand, a voltage of Vpp and $V_{ESC}$ are applied to a pedestal of Al or the like of the electrostatic chuck simultaneously, with the result that a DC voltage of Vpp/2+$V_{ESC}$ at the highest is applied to a spraying-prepared film provided on the surface of electrostatic chuck. At the same time, when a voltage in excess of a level necessary for adsorption is applied, abnormal discharge may occur at a port through which helium is supplied to the wafer back side. For the electrostatic chuck used in Example 3, voltage necessary for adsorption was 400 V and voltage at which abnormal discharge could occur was 1200 V, a voltage of Vpp/2+$V_{ESC}$ was set at 800 V. Knowing that Vpp was 2.1 kV in the low-deposition step, Vdc was −1050 V at the highest, and DC voltage for adsorption was set at −250 V. In the main etching step, Vdc was set at −1250 V at the highest and $V_{ESC}$ at −450 V, knowing that Vpp was 2.1 kV. However, an excessive voltage of Vpp/2+$V_{ESC}$ may evolve between the wafer and electrostatic chuck at the switching time in from one step to the other adopted in Example 3, which may be accompanied by fluctuations at a matching box, pressure fluctuations in a vacuum chamber and fluctuations of DC voltage output for adsorption, even when the $V_{ESC}$ level is set as above, to cause abnormal discharge at a port through which helium is supplied to the wafer back side. Example 3 adopted an interpolating step between the low-deposition and main etching steps, as illustrated by the sequence shown in FIG. 11. The interpolating step interpolates (e.g., linearly) conditional difference, e.g., in set gas flow rate, rf power or gas pressure in a vacuum chamber, between the low-deposition and main etching steps. This could prevent rapid plasma fluctuation and secure abnormal discharge margin. The interpolating time of 3 seconds was adopted in Example 3, but the optimum time is not limited thereto. Damages on an etching apparatus and wafer product can be reduced or minimized in the absence of the interpolating step by continuously monitoring abnormal discharge by DC voltage or DC current flowing in an electrostatic chuck and issuing an emergency alarm to suspend the treatment.

It should be further understood by those skilled in the art that although the foregoing description has been made on embodiments of the invention, the invention is not limited thereto and various changes and modifications may be made without departing from the spirit of the invention and the scope of the appended claims.

ADVANTAGES OF THE INVENTION

The dry etching method of the present invention can efficiently prevent deviation of a hole directionality on the short diameter side as a shape abnormality in an elliptic pattern, and secure hole directionality not only on the long diameter side but also on the short diameter side, thereby realizing high-precision etching. It can keep the above effect on a wafer plane stably for extended periods and thereby reduce load of an etching apparatus which realizes the present invention.

The invention claimed is:

1. An insulating film dry etching method for treating a work on which a mask of elliptic pattern is formed with a fluorocarbon gas, wherein
the etching process is divided into a first and second steps after the etching is started, the first step operating to deposit a polymer at a rate set lower than that in the second step, and controlling step time in accordance with ellipticity (long diameter/short diameter ratio) of the elliptic pattern.

2. The insulating film dry etching method according to claim 1, wherein
radical quantity in a plasma is monitored for a work, when a plurality of works are treated, in order to control first step time for the subsequent work, based on the monitored results.

3. The insulating film dry etching method according to claim 1, wherein
radical quantity in a plasma is monitored for a work, when a plurality of works are treated, in order to control pressure of helium supplied to the work back side in the first step time for the subsequent work, based on the monitored results.

4. An insulating film dry etching method for treating a work on which a mask of elliptic pattern is formed with a fluorocarbon gas, wherein
the etching process is divided into a first and second steps after the etching is started, the first step operating to deposit a polymer at a rate set lower than that in the second step, the rate being controlled in accordance with ellipticity (long diameter/short diameter ratio) of the elliptic pattern.

5. The insulating film dry etching method according to claim 4, wherein
a diluted gas of noble gas, oxygen gas or nitrogen gas is supplied at a higher rate in the first step than in the second step.

6. The insulating film dry etching method according to claim 4, wherein
radical quantity in a plasma is monitored for a work, when a plurality of works are treated, in order to control first step time for the subsequent work, based on the monitored results.

7. The insulating film dry etching method according to claim 4, wherein
a third step different from the first or second step is inserted between the first and second steps, the third step interpolating conditional difference, e.g., in set gas flow rate, rf power or gas pressure in a vacuum chamber, between the first and second steps.

8. An insulating film dry etching method for treating a work on which a mask of elliptic pattern is formed with a fluorocarbon gas, wherein
the etching process is divided into a first and second steps after the etching is started, the first step controlling gas pressure on the work back side in accordance with ellipticity (long diameter/short diameter ratio) of the elliptic pattern.

9. The insulating film dry etching method according to claim 8, wherein
surface temperature of the work is monitored, and pressure of a gas supplied to the work back side is controlled in such a way to keep the monitored level in a desired range.

* * * * *